United States Patent
Brandley et al.

(10) Patent No.: US 7,565,123 B2
(45) Date of Patent: Jul. 21, 2009

(54) APPARATUS FOR VOLTAGE LEVEL TEMPERATURE COMPENSATION

(75) Inventors: Delbert E. Brandley, Gardner, KS (US); Tuan N. Nguyen, Olathe, KS (US)

(73) Assignee: Honeywell International Inc., Morristown, NJ (US)

( * ) Notice: Subject to any disclaimer, the term of this patent is extended or adjusted under 35 U.S.C. 154(b) by 554 days.

(21) Appl. No.: 11/317,085

(22) Filed: Dec. 21, 2005

(65) Prior Publication Data

US 2007/0142015 A1    Jun. 21, 2007

(51) Int. Cl.
H04B 7/00      (2006.01)
H04B 1/06      (2006.01)

(52) U.S. Cl. .............. 455/232.1; 455/240.1; 455/250.1

(58) Field of Classification Search .............. 455/232.1, 455/240.1, 250.1, 251.1, 245.1, 355, 285, 455/296, 41.2, 130, 41.1
See application file for complete search history.

(56) References Cited

U.S. PATENT DOCUMENTS

| | | | | |
|---|---|---|---|---|
| 3,860,878 A | * | 1/1975 | Tanaka et al. | 327/47 |
| 3,997,802 A | * | 12/1976 | Hoehn | 327/513 |
| 4,171,492 A | * | 10/1979 | Burth | 327/513 |
| 4,531,235 A | * | 7/1985 | Brusen | 455/273 |
| 5,117,123 A | * | 5/1992 | Sendelweck | 327/378 |
| 6,108,527 A | * | 8/2000 | Urban et al. | 455/115.3 |
| 6,118,811 A | * | 9/2000 | Narumi et al. | 375/219 |
| 6,243,570 B1 | * | 6/2001 | Kobayashi | 455/340 |
| 6,359,498 B1 | * | 3/2002 | Kurihara et al. | 327/513 |
| 6,727,842 B1 | * | 4/2004 | Schleder et al. | 342/30 |
| 6,941,122 B2 | * | 9/2005 | Shim | 455/232.1 |
| 7,171,322 B2 | * | 1/2007 | Taylor | 702/106 |
| 7,174,142 B2 | * | 2/2007 | Watabe | 455/193.1 |
| 2002/0187766 A1 | | 12/2002 | Shim | |
| 2006/0030359 A1 | | 2/2006 | Behzad et al. | |

FOREIGN PATENT DOCUMENTS

| | | |
|---|---|---|
| EP | 0713288 A2 | 5/1996 |
| WO | 9844628 | 10/1998 |
| WO | 0076062 A1 | 12/2000 |

OTHER PUBLICATIONS

European Search Report 06126295.2, Mar. 16, 2007.

* cited by examiner

*Primary Examiner*—Sonny Trinh

(57) ABSTRACT

An apparatus is provided for improved temperature compensation of received RF signals. An RF receiver includes receiver circuitry which receives an RF signal and demodulates it to generate an output signal. Temperature compensation circuitry is coupled to the receiver circuitry and includes a diode having diode temperature characteristics. The temperature compensation circuitry adjusts the output signal of the receiver circuitry in response to the diode temperature characteristics to provide a tighter minimum trigger level.

18 Claims, 2 Drawing Sheets

APPARATUS FOR VOLTAGE LEVEL TEMPERATURE COMPENSATION

FIELD OF THE INVENTION

The present invention generally relates to radio communication devices, and more particularly relates to an improved apparatus for voltage level temperature compensation in circuits for radio communication devices.

BACKGROUND OF THE INVENTION

The output of radio frequency (RF) receiver circuitry is temperature dependant. Conventionally, such RF receiver circuitry includes a thermistor coupled to the output signal line to compensate for temperature changes. A thermistor is a resistor which changes its value in response to changes in temperature. For land based radio equipment where the temperature changes are rarely dramatic, a thermistor-based temperature compensation circuit providing ±3 dB of compensation may be sufficient. However, avionic RF equipment, such as avionic Traffic Collision Avoidance System (TCAS) RF receivers and other avionic transponder RF receivers must meet governmental requirements, such as requirements by the United States' Federal Aviation Administration (FAA) for minimum trigger levels (i.e., the variation in a received signal which would trigger a response by the avionic RF equipment). While conventional avionic transponders control the minimum trigger level by providing a thermistor to change the log-video amplifier gain over temperature, current FAA guidelines have set a tighter requirement for the temperature dependency of the minimum trigger level than the ±3 dB that thermistor circuitry can provide.

Thus, it is desirable to provide a temperature compensation circuit for RF receiver circuitry that provides a tighter output variation over temperature than ±3 dB. Furthermore, other desirable features and characteristics of the present invention will become apparent from the subsequent detailed description of the invention and the appended claims, taken in conjunction with the accompanying drawings and this background of the invention.

BRIEF SUMMARY OF THE INVENTION

A radio frequency (RF) receiver provides improved temperature compensation of received RF signals. The RF receiver includes receiver circuitry which receives an RF signal and demodulates it to generate an output signal. Temperature compensation circuitry is coupled to the receiver circuitry and includes a diode having diode temperature characteristics. The temperature compensation circuitry adjusts the output signal of the receiver circuitry in response to the diode temperature characteristics.

BRIEF DESCRIPTION OF THE DRAWINGS

The present invention will hereinafter be described in conjunction with the following drawing figures, wherein like numerals denote like elements.

DETAILED DESCRIPTION OF THE INVENTION

The following detailed description of the invention is merely exemplary in nature and is not intended to limit the invention or the application and uses of the invention. Furthermore, there is no intention to be bound by any theory presented in the preceding background of the invention or the following detailed description of the invention.

Figure 1:
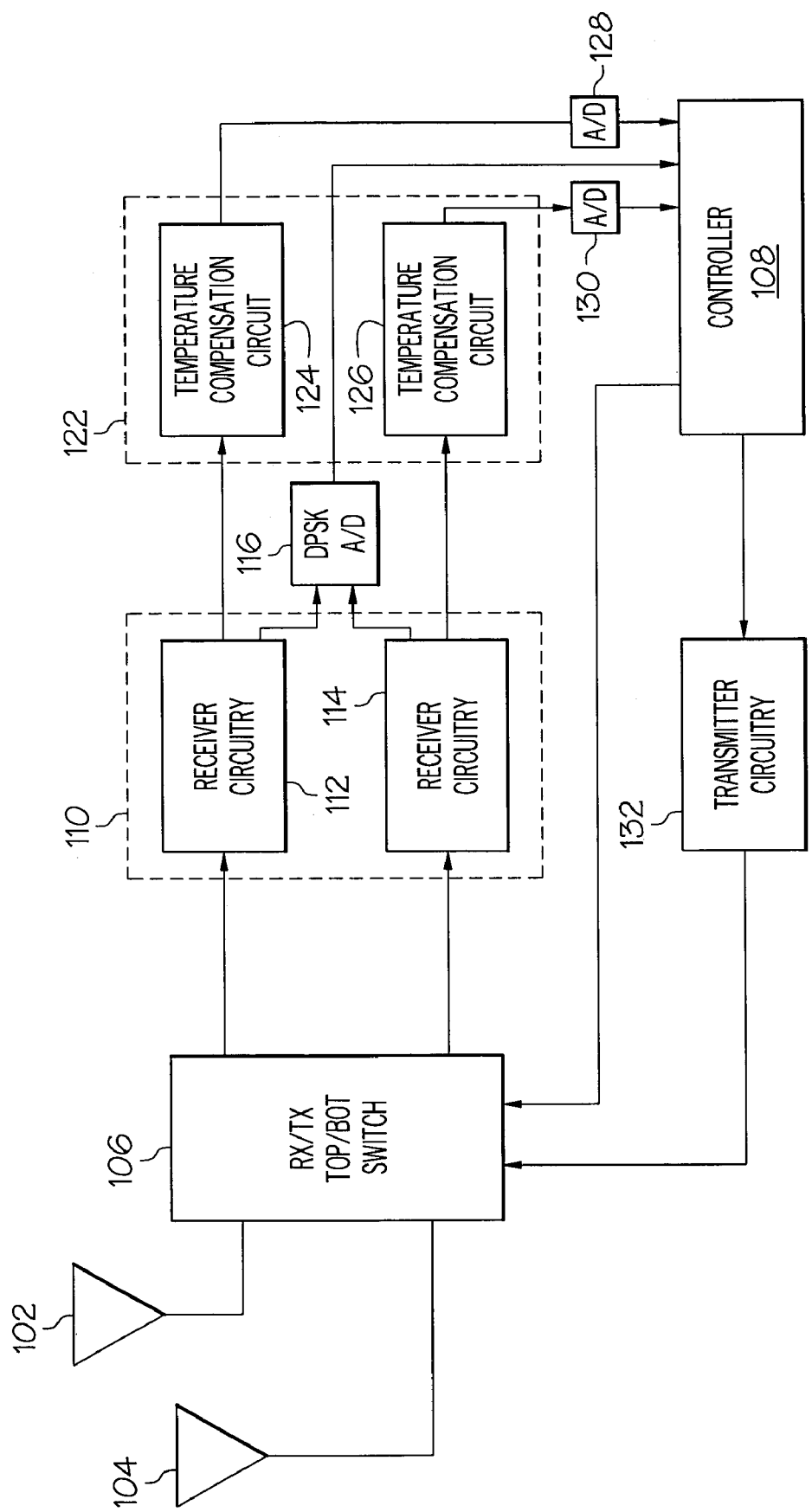
FIG. 1 is a block diagram of a radio frequency (RF) transponder in accordance with an embodiment of the present invention.

Referring to FIG. 1, a radio frequency (RF) avionic transponder 100 in accordance with an embodiment of the present invention includes diversity antennas 102 and 104 coupled to a receive/transmit switch 106 operating under control of a signal from controller 108. When the controller 108 signals the switch 106 to place it in the receive mode, the diversity antennas 102 and 104 are coupled to receiver circuitry 110 including a first receiver 112 and a second receiver 114, the diversity antenna 102 being coupled to the first receiver 112 and the diversity antenna 104 being coupled to the second receiver 114.

In accordance with typical transponder receiver circuitry 110 design, the first receiver 112 and the second receiver 114 generate respective log-video signals and limiting intermediate frequency (IF) signals. The limiting IF signals from the first receiver 112 and the second receiver 114 are provided to a digital phase shift keying (DPSK) analog-to-digital converter 116 in a conventional manner for generation of a digital DPSK signal for providing to the controller 108.

The first and second log-video signals from the first and second receivers 112, 114 are provided to temperature compensation circuitry 122 including a first temperature compensation circuit 124 and a second temperature compensation circuit 126 coupled to receive the first and second log-video signals, respectively, and generate therefrom respective first and second temperature compensated log-video signals. From the temperature compensation circuitry 122, the first and second temperature compensated log-video signals are provided to analog-to-digital converter 128 and analog-to-digital converter 130 for processing the signals before providing them to the controller 108 for processing by a video processor portion thereof. Analog-to-digital converters 128, 130 could alternatively be comparators to process the temperature compensated log-video signals, providing the resulting signals to the controller 108.

As is well known to those skilled in the art, the controller 108 includes the video processor portion and interrogation reply logic. The interrogation reply logic of the controller 108 determines if the processed temperature compensated log-video signals have a variation greater than a minimum trigger level (where the minimum trigger level is the amount of variation permitted due to changes in temperature) and generates a trigger signal in response thereto. The trigger signal is provided to transmitter circuitry 132 for conversion and modulation thereof and a transmission enable signal is provided to the switch 106 for transmission of an RF signal from one of the antennas 102, 104.

Figure 2:
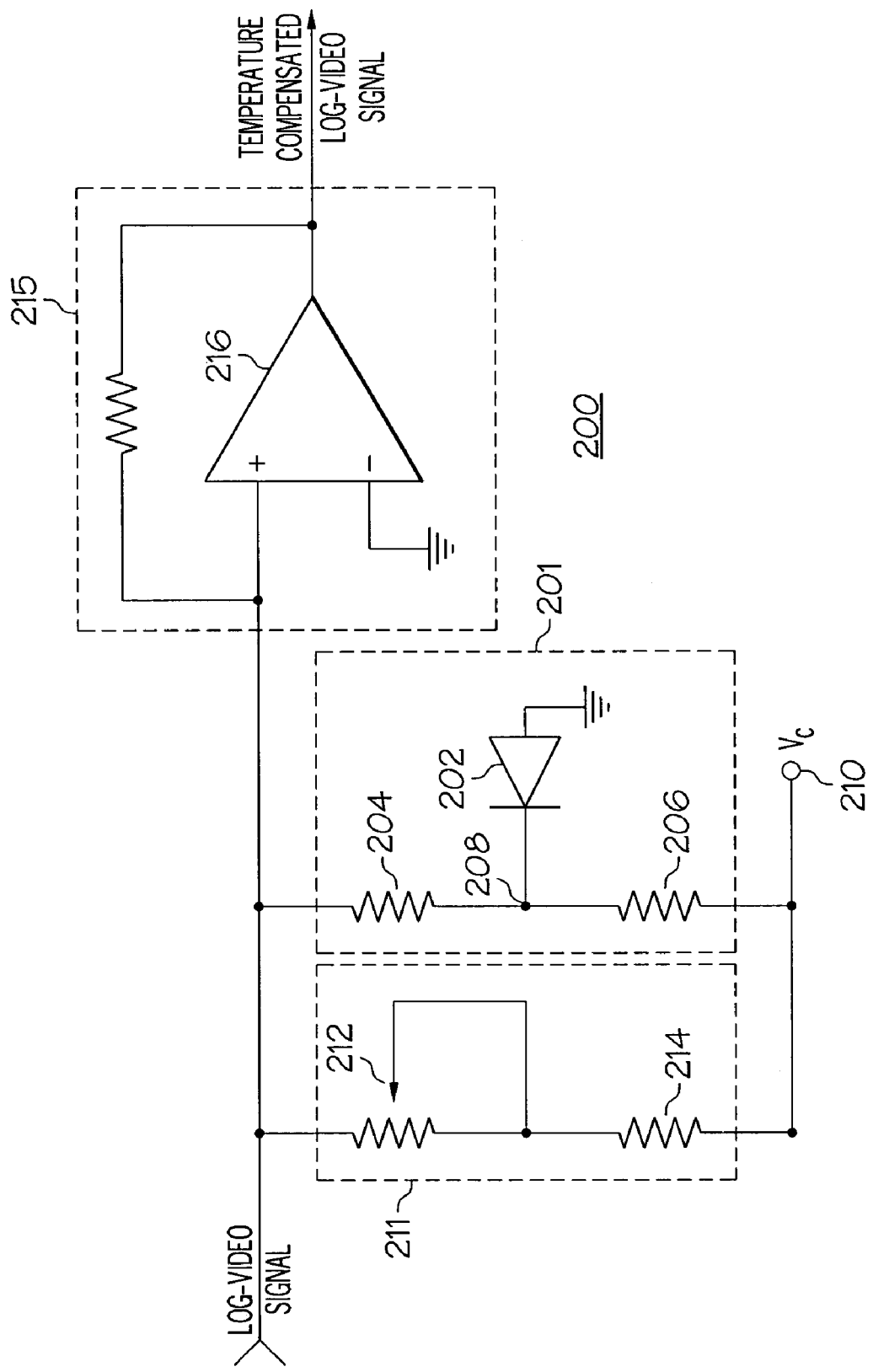
FIG. 2 is a circuit and block diagram of the temperature compensation circuit of the RF transponder of FIG. 1 in accordance with an embodiment of the present invention.

Referring to FIG. 2, in accordance with the embodiment of the present invention, the temperature compensation circuitry 122 is shown in greater detail. Since the structure of both temperature compensation circuits 124, 126 is the same, only one temperature compensation circuit 200 is shown. The temperature compensation circuit includes diode circuitry 201 and a current source 211 coupled to the log-video signal output from the receiver circuits 112, 114. In the diversity receiver construction described hereinabove, the diode circuitry includes a first diode coupled to the first receiver 112 and a second diode coupled to the second receiver 114.

The diode circuitry 201 includes a diode 202, a first resistor 204 and a second resistor 206 all connected to a common node 208. The diode 202 has diode temperature characteristics. The log-video signal has temperature dependant DC offset voltage characteristics, and the first resistor 204 is connected between the log-video signal outputted from the receiver circuitry 110 and the common node 208. The second resistor 206 is connected between the common node 208 and a constant voltage source 210. The first resistor 204 has a first resistive value and the second resistor 206 has a second resistive value. While the current source 211 can be any current source, and may be located elsewhere in the circuitry or even in software, in accordance with the embodiment of the present invention, the current source 211 includes a variable resistor 212 and a third resistor 214 connected in series between the log-video signal and the constant voltage source 210. The tap for the variable resistor 212 is connected to a node between the variable resistor 212 and the third resistor 214. In accordance with the embodiment of the present invention, the current source 211 makes adjustment of the minimum trigger level possible by enabling DC offset voltage adjustment of the log-video signal by adjusting the variable resistor 212.

A summing buffer 215 has a first input of an operational amplifier 216 thereof receiving the log-video signal and a second input of the operational amplifier 216 coupled to ground voltage. The summing buffer 215 generates a temperature compensated log-video signal at the output of the operational amplifier 216, thereby providing the RF avionic transponder 100 with a tighter minimum trigger level. In accordance with the present invention, the temperature compensated log-video signal is generated by the temperature compensation circuit 200 adjusting the log-video signal in response to the diode temperature characteristics of the diode 202, the temperature dependant DC offset voltage characteristics, the constant voltage 210, and the first and second resistive values of the first and second resistors 204, 206. In addition, in accordance with the embodiment of the present invention, the current source 211 also functions to center the output of the operational amplifier 216 in the optimal range of the analog-to-digital converters 128, 130.

Accordingly, the present invention provides an improved temperature compensation circuit 200 which provides an output variation of less than ±1 dB. In addition, the temperature compensation circuit 200 provides a linear variation over temperature as opposed to the exponential variation of conventional thermistor-based temperature compensation circuits, in that, in accordance with the present invention, the temperature compensation circuit 200 provides a bias to the log-video signal that is a constant millivolt per degree Centigrade. In addition, the amount of temperature compensation can advantageously be modified by changing the resistive values of one or both of the first resistor 204 and the second resistor 206 and the minimum trigger level can be adjusted by adjusting the variable resistor 212.

While at least one exemplary embodiment has been presented in the foregoing detailed description of the invention, it should be appreciated that a vast number of variations exist. For example, while the embodiment of the present invention described hereinabove is an RF avionic transponder 100, the present invention may be implemented in any RF receiver, providing temperature compensation therefore. It should also be appreciated that the exemplary embodiment or exemplary embodiments are only examples, and are not intended to limit the scope, applicability, or configuration of the invention in any way. Rather, the foregoing detailed description will provide those skilled in the art with a convenient road map for implementing an exemplary embodiment of the invention, it being understood that various changes may be made in the function and arrangement of elements described in an exemplary embodiment without departing from the scope of the invention as set forth in the appended claims.

What is claimed is:

1. A radio frequency (RF) receiver comprising:
    receiver circuitry receiving an RF signal and demodulating the RF signal to generate an output signal; and
    temperature compensation circuitry coupled to the receiver circuitry and comprising a single diode having diode temperature characteristics, wherein the output signal has temperature dependent DC offset voltage characteristics, and wherein the temperature compensation circuitry adjusts the output signal in response to the diode temperature characteristics and the temperature dependent DC offset voltage characteristics.

2. The RF receiver of claim 1 further comprising a voltage source coupled to the temperature compensation circuitry and supplying a constant voltage thereto, and wherein the temperature compensation circuitry adjusts the output signal in response to the diode temperature characteristics, the temperature dependent DC offset voltage characteristics and the constant voltage.

3. The RF receiver of claim 2 further comprising a summing buffer amplifier coupled to the receiver circuitry, the diode and the voltage source for providing a temperature compensated output signal generated in response to the diode temperature characteristics, the temperature dependent DC offset voltage characteristics and the constant voltage.

4. The RE receiver of claim 2 wherein the temperature compensation circuitry comprises a first resistor having a first resistive value and coupled to the receiver circuitry and the diode, and wherein the temperature compensation circuitry adjusts the output signal in response to the diode temperature characteristics, the temperature dependent DC offset voltage characteristics, the constant voltage and the first resistive value.

5. The RF receiver of claim 4 wherein the temperature compensation circuitry further comprises a second resistor having a second resistive value and coupled to the diode, and wherein the temperature compensation circuitry adjusts the output signal in response to the diode temperature characteristics, the temperature dependent DC offset voltage characteristics, the constant voltage and the first and second resistive values.

6. The RF receiver of claim 5 wherein the temperature compensation circuitry comprises a common node and wherein the first resistor, the second resistor and the diode are connected to the common node.

7. The RF receiver of claim 6 further comprising a summing buffer amplifier having a first input, a second input and an output, wherein the first input is coupled to the receiver circuitry for receiving the output signal therefrom and is connected to a first side of the first resistor, a second side of the first resistor connected to the common node, and wherein the second input is connected to a ground voltage, and wherein the output provides a temperature compensated output signal in response to the diode temperature characteristics, the temperature dependent DC offset voltage characteristics, the constant voltage and the first and second resistive values.

8. An avionic radio frequency (RF) device comprising:
receiver circuitry receiving an RF signal from an antenna and demodulating the RF signal to generate an output signal;
temperature compensation circuitry coupled to the receiver circuitry and comprising diode circuitry having diode temperature characteristics; and
a voltage source coupled to the temperature compensation circuitry and supplying a constant voltage thereto,
wherein the output signal has temperature dependent DC offset voltage characteristics, and wherein the temperature compensation circuitry adjusts the output signal in response to the diode temperature characteristics, the temperature dependent DC offset voltage characteristics and the constant voltage.

9. The avionic RF device of claim 8 further comprising a summing buffer amplifier coupled to the receiver circuitry, the diode circuitry and the voltage source for providing a temperature compensated output signal generated in response to the diode temperature characteristics, the temperature dependent DC offset voltage characteristics and the constant voltage.

10. The avionic RF device of claim 8 wherein the diode circuitry comprises a first resistor having a first resistive value and a first diode, the first diode having the diode temperature characteristics, and wherein the first resistor is coupled to the receiver circuitry and is connected to the first diode, and wherein the temperature compensation circuitry adjusts the output signal in response to the diode temperature characteristics, the temperature dependent DC offset voltage characteristics, the constant voltage and the first resistive value.

11. The avionic RF device of claim 10 wherein the diode circuitry further comprises a second resistor having a second resistive value and connected to the first diode and the first resistor, and wherein the temperature compensation circuitry adjusts the output signal in response to the diode temperature characteristics, the temperature dependent DC offset voltage characteristics, the constant voltage and the first and second resistive values.

12. The avionic RF device of claim 11 wherein the diode circuitry comprises a common node and wherein the first resistor, the second resistor and the diode are connected to the common node.

13. The avionic RE device of claim 8 wherein the receiver circuitry comprises diversity receivers having a first receiver and a second receiver, and wherein the diode circuitry comprises a first diode coupled to the first receiver and a second diode coupled to the second receiver.

14. An avionic transponder device comprising:
receiver circuitry receiving an RF signal and demodulating the RE signal to generate a log-video signal; and
temperature compensation circuitry coupled to the receiver circuitry and comprising diode circuitry having diode temperature characteristics, wherein the temperature compensation circuitry adjusts the log-video signal in response to the diode temperature characteristics to generate a temperature compensated log-video signal.

15. The avionic transponder of claim 14 further comprising:
one or more antennas receiving and transmitting RE signals, wherein the antennas are coupled to the receiver circuitry for providing a received RE signal thereto;
transmitter circuitry coupled to the antennas and modulating an input signal to generate an RE signal to provide to the antennas for transmission therefrom; and
a controller coupled to the temperature compensation circuitry and the transmitter circuitry for generating a trigger signal and providing the trigger signal as an input signal to the transmitter circuitry in response to determining that the temperature compensated log-video signal has a signal variation greater than a minimum trigger level.

16. The avionic transponder of claim 15 further comprising a voltage source coupled to the temperature compensation circuitry and supplying a constant voltage thereto, and wherein the log-video signal has temperature dependent DC offset voltage characteristics, and wherein the temperature compensation circuitry adjusts the log-video signal in response to the diode temperature characteristics, the temperature dependent DC offset voltage characteristics and the constant voltage to generate the temperature compensated log-video signal.

17. The avionic transponder of claim 16 wherein the diode circuitry comprises a first resistor having a first resistive value, a second resistor having a second resistive value, and a first diode having the diode temperature characteristics, and wherein the first resistor is coupled to the receiver circuitry and is connected to the first diode, and wherein the second resistor is connected to the diode, the first resistor and the voltage source, and wherein the temperature compensation circuitry adjusts the log-video signal in response to the diode temperature characteristics, the temperature dependent DC offset voltage characteristics, the constant voltage and the first and second resistive values to generate the temperature compensated log-video signal.

18. The avionic transponder of claim 15 wherein the receiver circuitry comprises diversity receivers having a first receiver and a second receiver, and wherein the diode circuitry comprises a first diode coupled to the first receiver and a second diode coupled to the second receiver.

* * * * *

UNITED STATES PATENT AND TRADEMARK OFFICE
CERTIFICATE OF CORRECTION

PATENT NO. : 7,565,123 B2  Page 1 of 1
APPLICATION NO. : 11/317085
DATED : July 21, 2009
INVENTOR(S) : Brandley et al.

It is certified that error appears in the above-identified patent and that said Letters Patent is hereby corrected as shown below:

Col. 4, Line 35, Claim 4, the initials RE should read --RF--

Col. 5, Line 44, Claim 13, the initials RE should read --RF--

Col. 5, Line 51, Claim 14, the initials RE should read --RF--

Col. 6, Lines 9, 11 and 13, Claim 15, the initials RE should read --RF--

Signed and Sealed this

Twentieth Day of April, 2010

David J. Kappos
*Director of the United States Patent and Trademark Office*